(12) United States Patent
Salik et al.

(10) Patent No.: US 10,559,532 B2
(45) Date of Patent: Feb. 11, 2020

(54) LAYOUT TECHNIQUES FOR HIGH-SPEED AND LOW-POWER SIGNAL PATHS IN INTEGRATED CIRCUITS WITH SMALL CHANNEL DEVICES

(71) Applicant: QUALCOMM Incorporated, San Diego, CA (US)

(72) Inventors: Marina Salik, Raleigh, NC (US); Anirban Banerjee, Cary, NC (US); Elizabeth Deleev Hylander-Priebe, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/906,116

(22) Filed: Feb. 27, 2018

(65) Prior Publication Data

US 2019/0267324 A1   Aug. 29, 2019

(51) Int. Cl.
*H01L 23/528* (2006.01)
*H01L 23/552* (2006.01)
*H01L 21/8234* (2006.01)
*H01L 23/66* (2006.01)
*H01L 21/768* (2006.01)
*H01L 27/02* (2006.01)

(52) U.S. Cl.
CPC .... *H01L 23/5286* (2013.01); *H01L 21/76895* (2013.01); *H01L 21/823475* (2013.01); *H01L 23/552* (2013.01); *H01L 23/66* (2013.01); *H01L 27/0207* (2013.01)

(58) Field of Classification Search
None
See application file for complete search history.

(56) References Cited

U.S. PATENT DOCUMENTS 7,037,820 B2 *   5/2006   Booth ................. H01L 23/5223
257/773

\* cited by examiner

*Primary Examiner* — Long Pham
(74) *Attorney, Agent, or Firm* — Patterson & Sheridan, L.L.P

(57) ABSTRACT

Certain aspects of the present disclosure generally relate to layout techniques for high-speed and low-power signal paths in integrated circuits with small channel devices. More specifically, according to certain aspects, an integrated circuit may comprise a plurality of layers, wherein at least a portion of the plurality of layers is configured to form a power/ground grid having odd-numbered metal layers and even-numbered metal layers, wherein a majority of traces of the even-numbered metal layers have a first orientation, and wherein a majority of traces of at least one of the odd-numbered metal layers are oriented parallel to the majority of the traces of the even-numbered metal layers; and one or more circuit components configured to use high-speed, low-power signals carried by one or more of the plurality of layers and to be powered by the power/ground grid.

18 Claims, 11 Drawing Sheets

LAYOUT TECHNIQUES FOR HIGH-SPEED AND LOW-POWER SIGNAL PATHS IN INTEGRATED CIRCUITS WITH SMALL CHANNEL DEVICES

TECHNICAL FIELD

Certain aspects of the present disclosure generally relate to electronic circuits and, more particularly, to layout techniques and apparatus for high-speed and low-power signal paths in integrated circuits with small channel devices.

BACKGROUND

An integrated circuit (IC) is a device, which includes a plurality of electronic components (e.g. transistors, resistors, capacitors, etc.). These components are interconnected to form multiple circuit components (gates, cells, memory units, etc.) on the IC. Modern very large scale integration (VLSI) integrated circuits are typically made up of a power/ground (P/G) grid with a layer structure having multiple layers of wiring (called "metal layers") that interconnect its electronic and circuit components. Each metal layer typically has a general wiring direction (e.g., a majority of the traces in the metal layer share the same direction, running substantially parallel to one another), and this general direction alternates between successive metal layers. Many IC designs use the Manhattan wiring model, where in each metal layer, all supplies to the IC's electronic and circuit components (e.g., global power supply and global ground) are laid out in a grid of parallel x-oriented or parallel y-oriented strips, and the components connect to these strips. Designs with multiple metal layers exhibit alternating layers of generally x-oriented and generally y-oriented wiring. In a multi-layer design, electrical interconnects (vias) between the metal layers allow the IC's components to be connected to the power and ground strips and to each other, thus completing the circuit.

To synchronize data transfer between the electrical components of the IC, clock signals may be generated by a clock signal generator and provided to the IC through clock pins. Clock signals are periodic signals alternating in amplitude between binary 0 and 1 (logical high and low). After receiving the clock signals from an external source (e.g., clock signal generator external to the IC), one or more of the metal layers in the P/G grid carry current to power the electrical components of the IC that drive or receive the clock signals.

An important aspect of IC design includes ensuring signal integrity, especially with changes in process, voltage, and temperature (PVT). For example, if the wire resistance and/or cell current of some cells within the IC exceeds a predetermined limit, voltage drops (also referred to as "IR drops" based on the voltage being equal to the current (I) multiplied by the resistance (R)) may occur, causing an increase in gate and signal delays and, in the worst case, switching failures of the integrated circuit. Thus, in order to avoid failures caused by signal integrity problems, sufficient electrical power should be provided to the cells within the integrated circuit.

In some cases, the IC may be constructed with small channel ultra-low-threshold-voltage implanted devices. In such cases, considerable power may be consumed to compensate for the voltage drop (IR drop) associated with the clock signal path of the small channel device. As a result, the peak-to-peak eye of the clock signal is significantly reduced for lower power (e.g., 825 mV) and high-speed applications.

SUMMARY

Certain aspects of the present disclosure generally relate to layout techniques for high-speed and low-power signal paths in integrated circuits with small channel devices.

Certain aspects of the present disclosure provide an integrated circuit (IC). The IC generally includes a plurality of layers, wherein at least a portion of the plurality of layers is configured to form a power/ground grid having odd-numbered metal layers and even-numbered metal layers, wherein a majority of traces of the even-numbered metal layers have a first orientation, and wherein a majority of traces of at least one of the odd-numbered metal layers are oriented parallel to the majority of the traces of the even-numbered metal layers. The IC further comprises one or more circuit components configured to use high-speed, low-power signals carried by one or more of the plurality of layers and to be powered by the power/ground grid.

Certain aspects of the present disclosure provide a method for fabricating an IC. The method generally includes forming one or more circuit components in the IC. The method also includes forming a plurality of layers of the IC above the one or more circuit components, wherein at least a portion of the plurality of layers is configured to form a power/ground grid having odd-numbered metal layers and even-numbered metal layers, wherein a majority of traces of the even-numbered metal layers have a first orientation, wherein a majority of traces of at least one of the odd-numbered metal layers are oriented parallel to the traces of the even-numbered metal layers, and wherein the one or more circuit components are configured to use high-speed, low-power signals carried by one or more of the plurality of layers.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Metal Layers of a Power/Ground Grid

As described above, integrated circuits (e.g., VLSI ICs) typically include a power/ground (P/G) grid with a layer structure having multiple layers of wiring (called "metal layers") that interconnect its electronic components and vias that interconnect the wiring between the multiple layers.

The material commonly used to form conductors in semiconductor integrated circuits (ICs) is metal, such as copper, aluminum, various alloys, polycrystalline silicon (polysilicon), and the like. The term "metal" is used herein to cover any type of conductor, including but not limited to the foregoing metals and polysilicon. The terms conductive lines or paths, strips, wires, and traces are used interchangeably herein to refer to an electrical conductor. Metal layers will be referred to by number, such as M3 for metal layer three, and so on.

Figure 1:
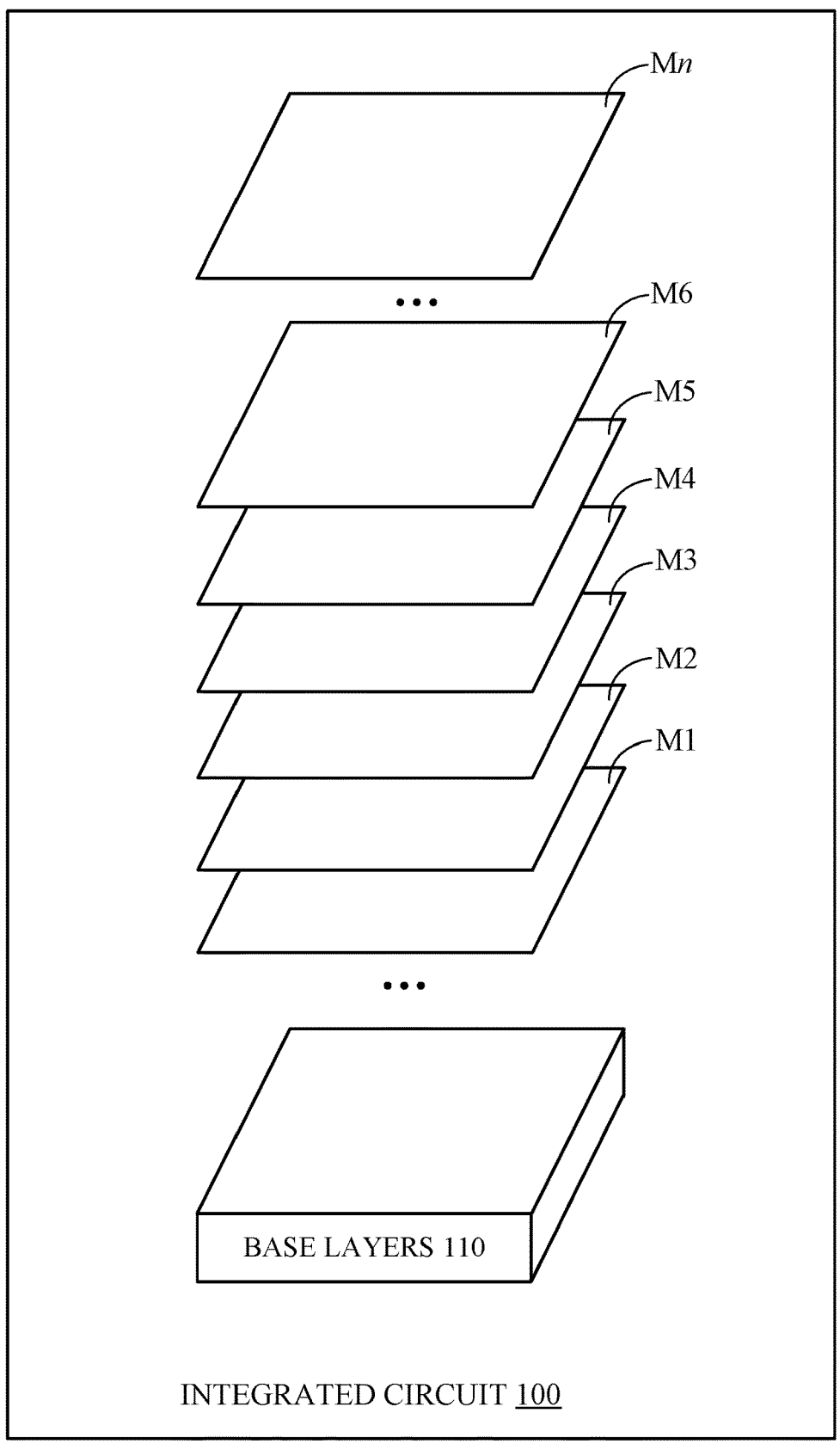
FIG. 1 illustrates an example metal layer stack of an integrated circuit (IC), in accordance with certain aspects of the present disclosure.

The metal layers of an IC's P/G grid comprise odd-numbered metal layers and even-number metal layers. FIG. 1 illustrates an example integrated circuit (IC) 100 comprising base layers 110 as well as a P/G grid having metal layers M1-Mn (where n may be any positive integer). The base layers 110, in certain aspects, may include one or more semiconductive layers to form circuit components (e.g., field-effect transistors with a source, gate, and drain), which may also include oxide and/or polysilicon (often referred to as "poly") features. In certain aspects, the M1-Mn metal layers may include M1-M6 metal layers as well as M7 and M8 metal layers, among other layers. The M1-M8 metal layers provide power rails, such as one or more power supply voltage rails and reference potential (e.g., electrical ground) rails. In cases where the IC 100 is constructed with small channel devices (e.g., having a width of 7 or 8 nm), the top metal layers of the M1-Mn stack include wider and thus less resistive traces, while the lower level metal layers of the stack include narrower and more resistive traces. In such cases, the lower level metal layers of the stack are formed as such to be able to interface with the semiconductive layers of the base layers 110 that form the narrow small channel devices. In other words, these small channel devices may form a bottleneck for routing signal and power/ground connections thereto, such that narrower traces (with higher resistance) are used to fan out from the base layers and lower levels of the power/ground grid, whereas wider traces (with lower resistance) are used in upper levels of the power/ground grid. Accordingly, certain embodiments described below relate to reducing the IR drop of the high-speed, lower-power signals as the signals travel through the M1-Mn stack to allow the small channel devices of the IC 100 to receive the high-speed, lower-power signals with a higher voltage.

Although the metal layers are shown to be separated with some distance from each other, in an actual IC, the layers may most likely be stacked on top of each other and touching. Traditionally, the odd-numbered metal layers comprise wires or traces (not shown) that, at least for the most part, run in a first direction (e.g., in the y direction in a Cartesian coordinate system) while the even-numbered metal layers comprise traces (not shown) that run, at least for the most part, in a second direction (in the x direction), perpendicular to the first direction. The traces of the odd-numbered metal layers conventionally have an orientation that is perpendicular to the orientation of the traces of the even-numbered metal layers, in an effort to reduce signal coupling between the layers.

Figure 2:
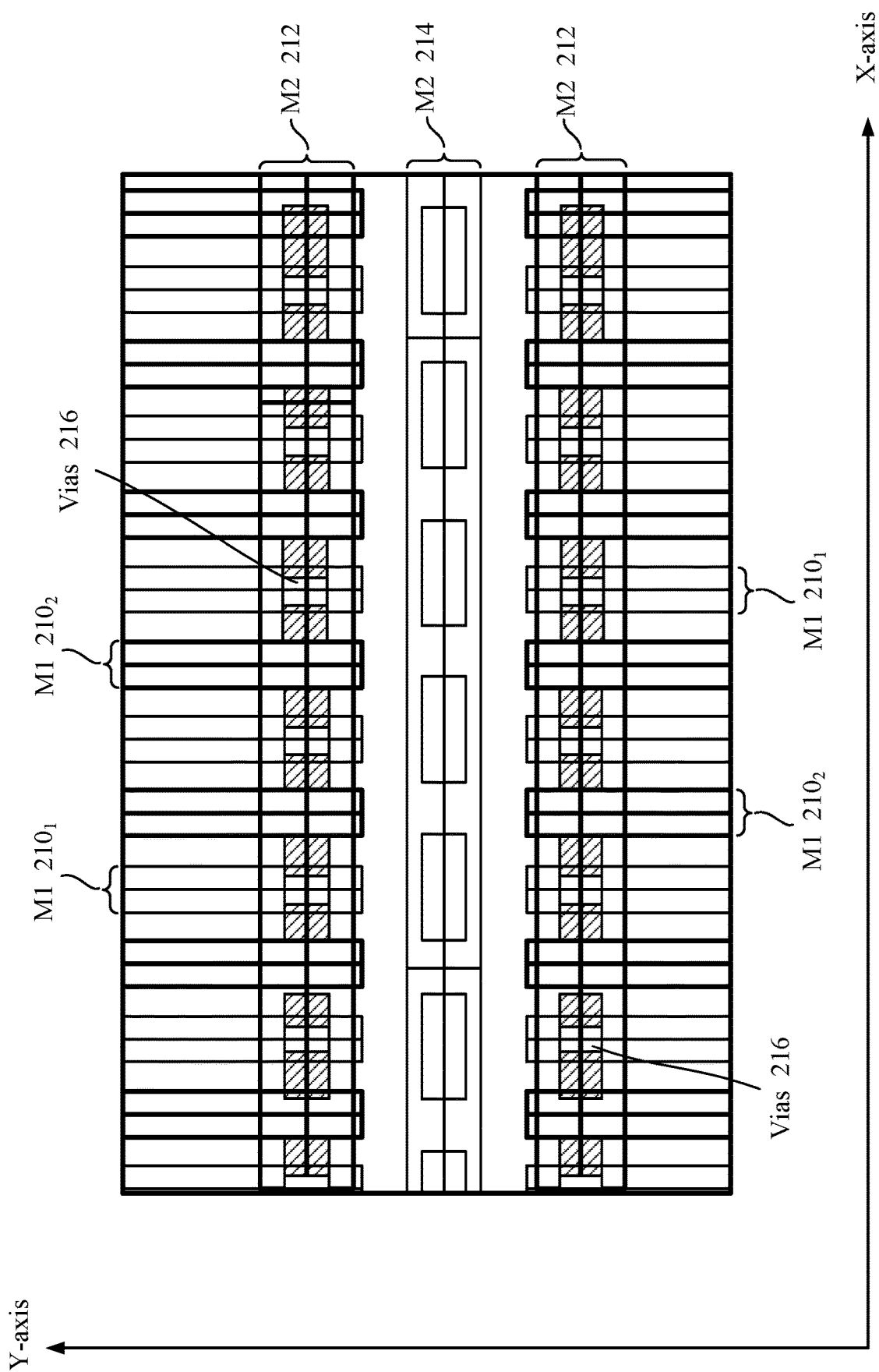
FIG. 2 illustrates example M1 and M2 metal layers, in accordance with certain aspects of the present disclosure.

FIG. 2 illustrates example overlapping M1 and M2 metal layers from a top-down perspective. As shown, M1 traces 210 may generally be oriented in the y-direction and may comprise two different types of metals (e.g., A metals (shown as M1 traces $210_1$) and B metals (shown as M1 traces $210_2$), each with a different material and grade of conductivity). For certain aspects as illustrated in FIG. 2, the M1 traces $210_1$ may be interleaved with the M1 traces $210_2$. The M1 traces 210 may have the same width (e.g., 34 nm).

As shown in FIG. 2, the M2 traces are generally oriented in the x-direction. For example, the middle rail is a narrower M2 metal strip 214 (e.g., having a width of 80 nm), while the two other x-oriented conductors are wider M2 rails 212 (e.g., with widths of 100 nm). FIG. 2 also shows a number of vias 216 for connecting the M1 210 and M2 212/214 conductors. The term "via" as used herein generally refers to an area or opening in a dielectric layer containing an electrical conductor that provides an electrical pathway from one metal layer to the metal layer above and/or below. The electrical pathway may comprise a metal that fills the opening. Alternatively, the walls (e.g., the lateral surfaces) of the via may be conductive. The vias 216 may be used to connect the M2 through M6 rails.

Figure 3:
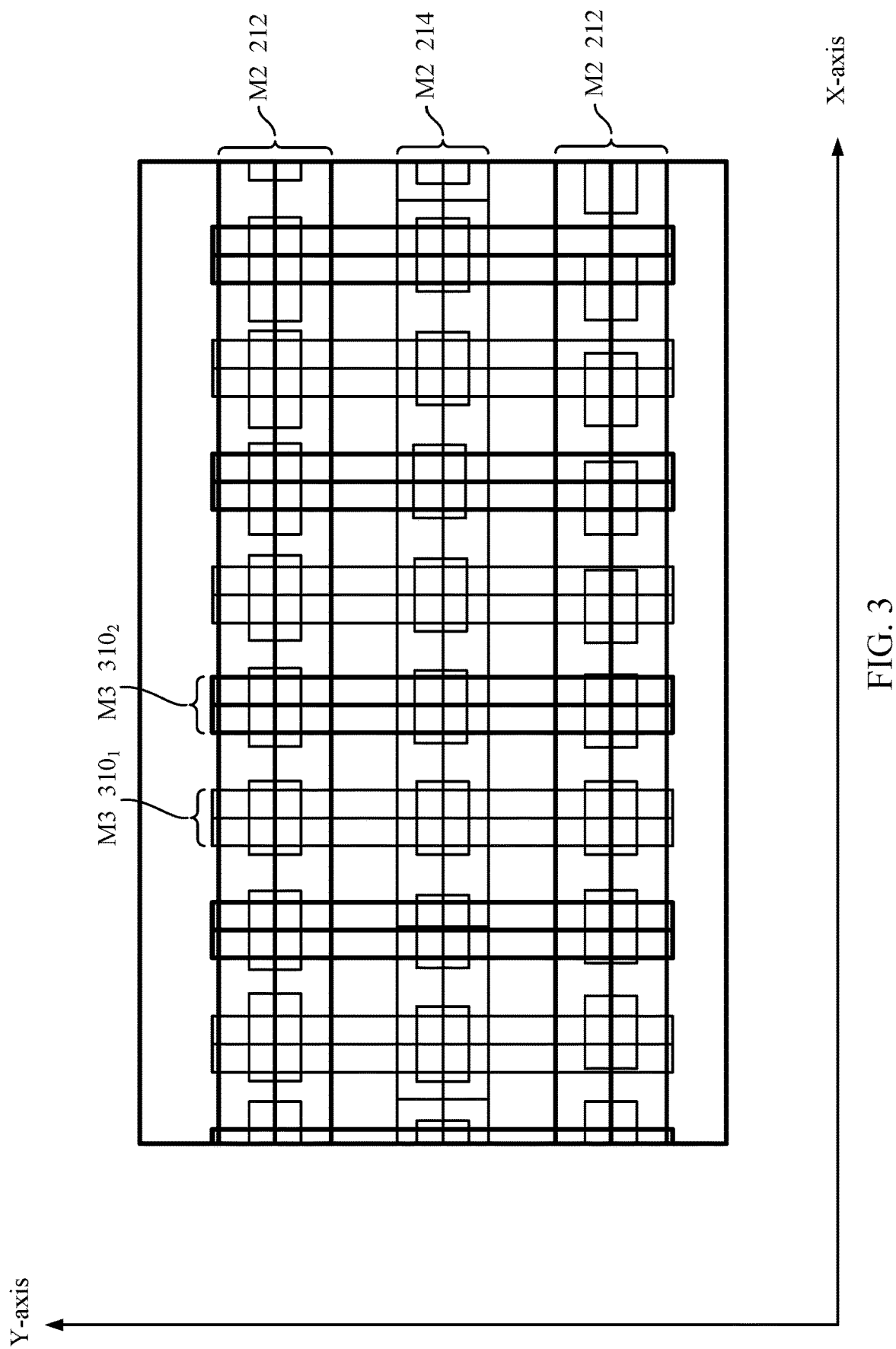
FIG. 3 illustrates example M2 and M3 metal layers, in accordance with certain aspects of the present disclosure.

FIG. 3 illustrates example overlapping M2 and M3 metal layers from a top-down perspective. As shown, the M3 rails or traces 310 (e.g., having a width of 60 nm) may be oriented to run in the y-direction and arranged next to each other. Similar to the M1 rails 210 shown in FIG. 2, the M3 traces 310 may comprise two different types of metals (e.g., A (shown as M3 rail 310₁) and B metals (shown as M3 rail 310₂). For certain aspects as illustrated in FIG. 3, the M3 traces 310₁ may be interleaved with the M3 traces 310₂. Similar to FIG. 2, FIG. 3 also shows M2 traces that are oriented to run in the x-direction. The middle rail is a narrower M2 metal strip 214 (e.g., having a width of 80 nm), while the two other x-oriented conductors are wider M2 rails 212 (e.g., with widths of 100 nm).

Figure 4:
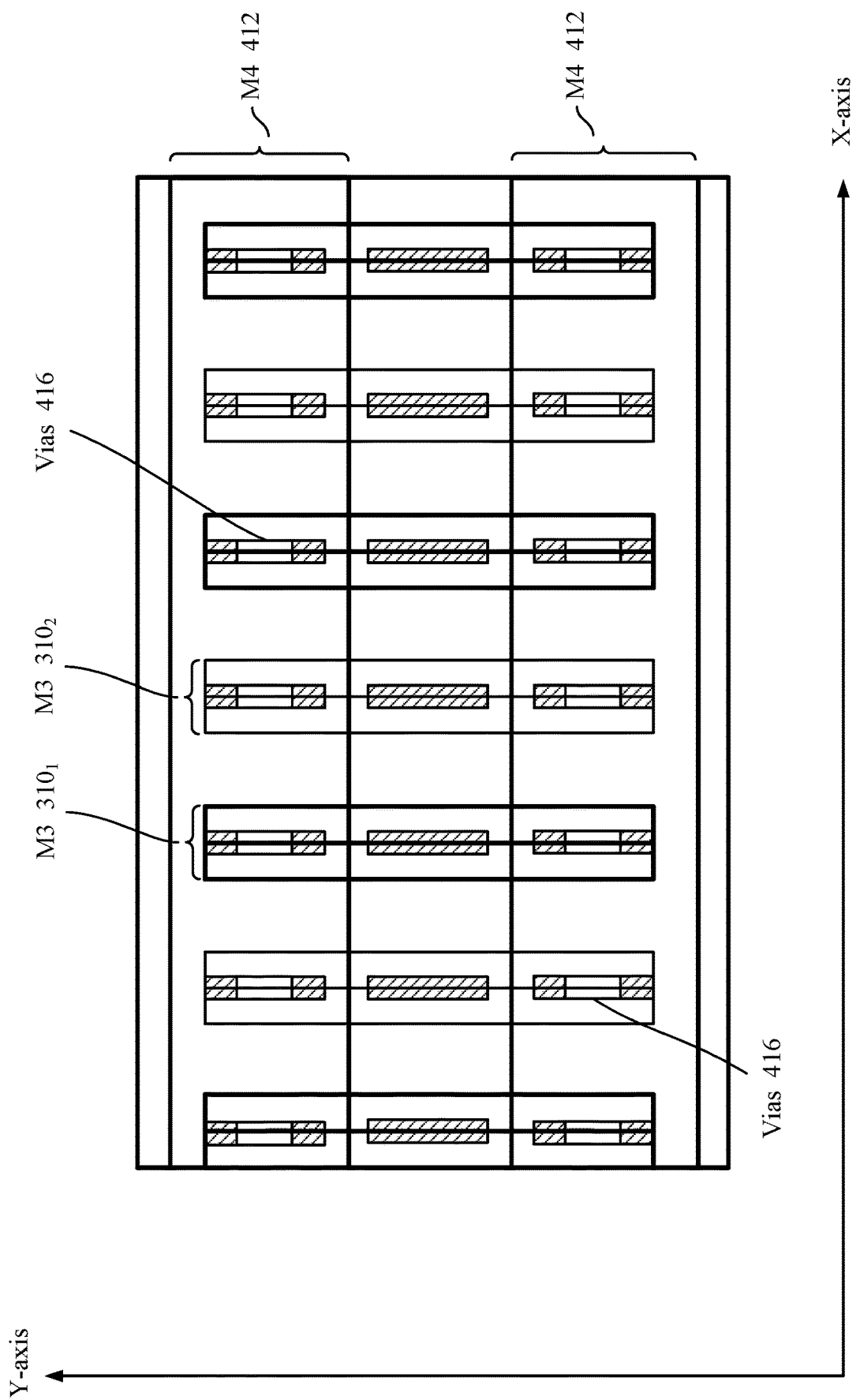
FIG. 4 illustrates example M3 and M4 metal layers, in accordance with certain aspects of the present disclosure.

FIG. 4 illustrates example overlapping M3 and M4 metal layers. As shown, the M3 traces 310 are generally oriented in the y-direction, while the M4 traces 412 are generally oriented in the x-direction. More specifically, FIG. 4 illustrates two M4 traces 412 (e.g., having widths of 150 nm) generally oriented in the x-direction. The M3 traces 310 may be electrically connected to the M4 traces 412 by vias 416.

As described above, in some cases, the IC may be constructed with small channel (e.g., 8 nm) ultra-low-threshold-voltage implanted devices. In such cases, considerable power may be consumed to compensate for the voltage drop (IR drop) associated with the high-speed, low-power signal paths of the small channel devices. As a result, the peak-to-peak eye of the signal is significantly reduced for lower power (e.g., 825 mV) and high-speed applications. In some aspects, the high-speed, low-power signals may comprise clock signals that are generated, for example, by a clock signal and received by the IC pins. As described above, clock signals may be used by the various circuit components for synchronizing data transmission between the components.

Accordingly, certain aspects described herein relate to layout techniques for high-speed, low-power signal paths designed with small channel devices. In order to reduce the voltage drop and, thereby, reduce the amount of power required to compensate for the voltage drop (IR drop) associated with the signal path of the small channel device, in some aspects, traces of at least one odd-numbered metal layer may be oriented parallel to the traces of even-numbered metal layers. For example, in some aspects, the M5 trace(s) may run in the x-direction (i.e., parallel to the traces of M2, M4, and M6). In some aspects, in addition to or instead of the M5 trace(s), the M3 traces may also be oriented in the x-direction (i.e., parallel to the traces of M2, M4, and M6).

Figure 5:
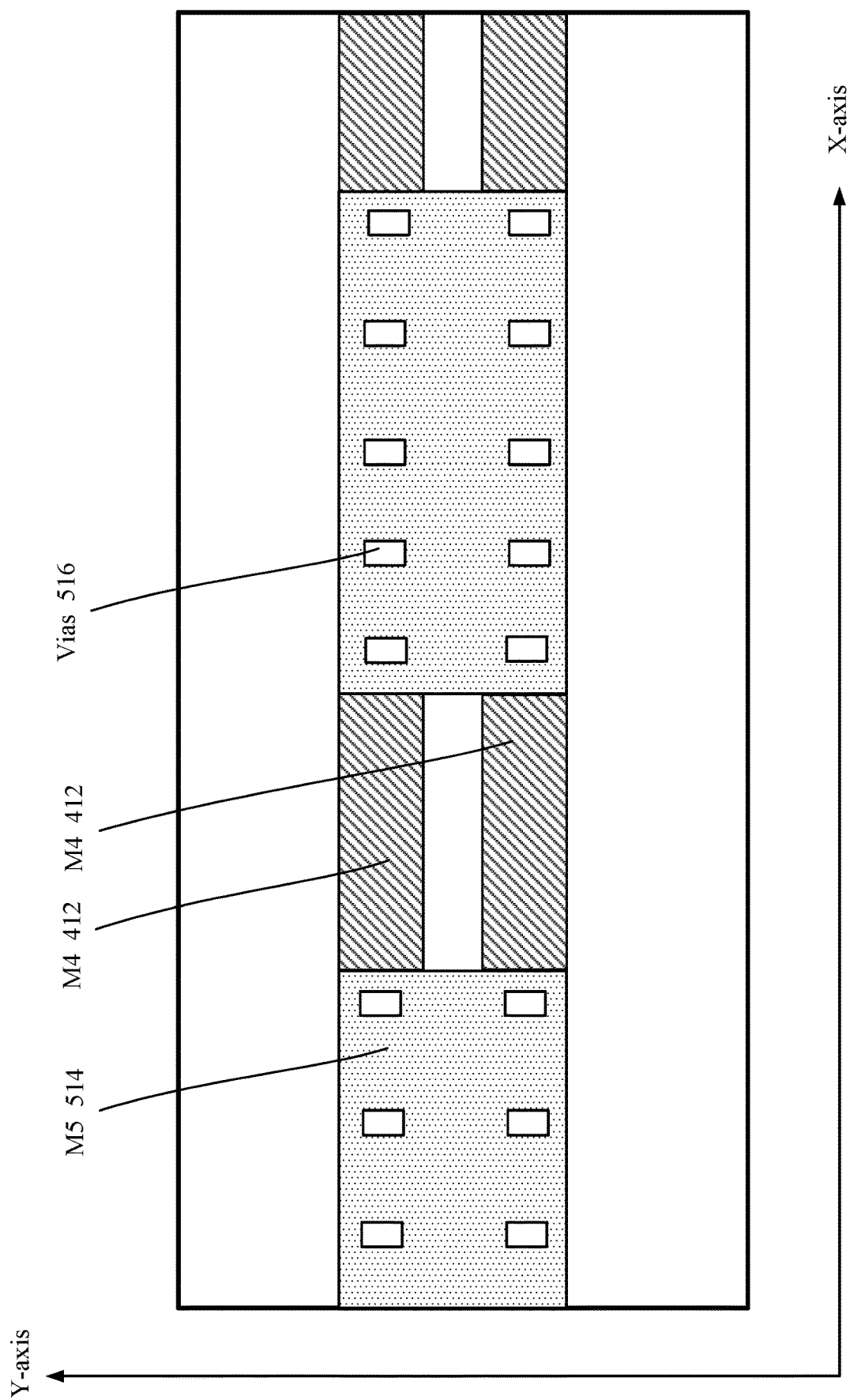
FIG. 5 illustrates example M4 and M5 metals layers, in accordance with certain aspects of the present disclosure.

FIG. 5 illustrates an example arrangement of M4 rails 412 together with an M5 rail 514. As shown, the M5 rail 514 (e.g., having a width of 434 nm) is oriented in the x-direction and placed on top of the M4 rails 412 (e.g., having widths of 150 nm), which are also oriented in the x-direction. This results in a significant reduction in IR drop and an increase in the signal-to-noise ratio. The M5 rail 514 may be electrically connected to the M4 rails 412 using example vias 516. In some embodiments, there may be a fewer or a higher number of vias 516 used. Although not shown in FIGS. 3 and 4, as described above, in some aspects, the M3 traces may also run parallel to the M5 rail 514.

Figure 6:
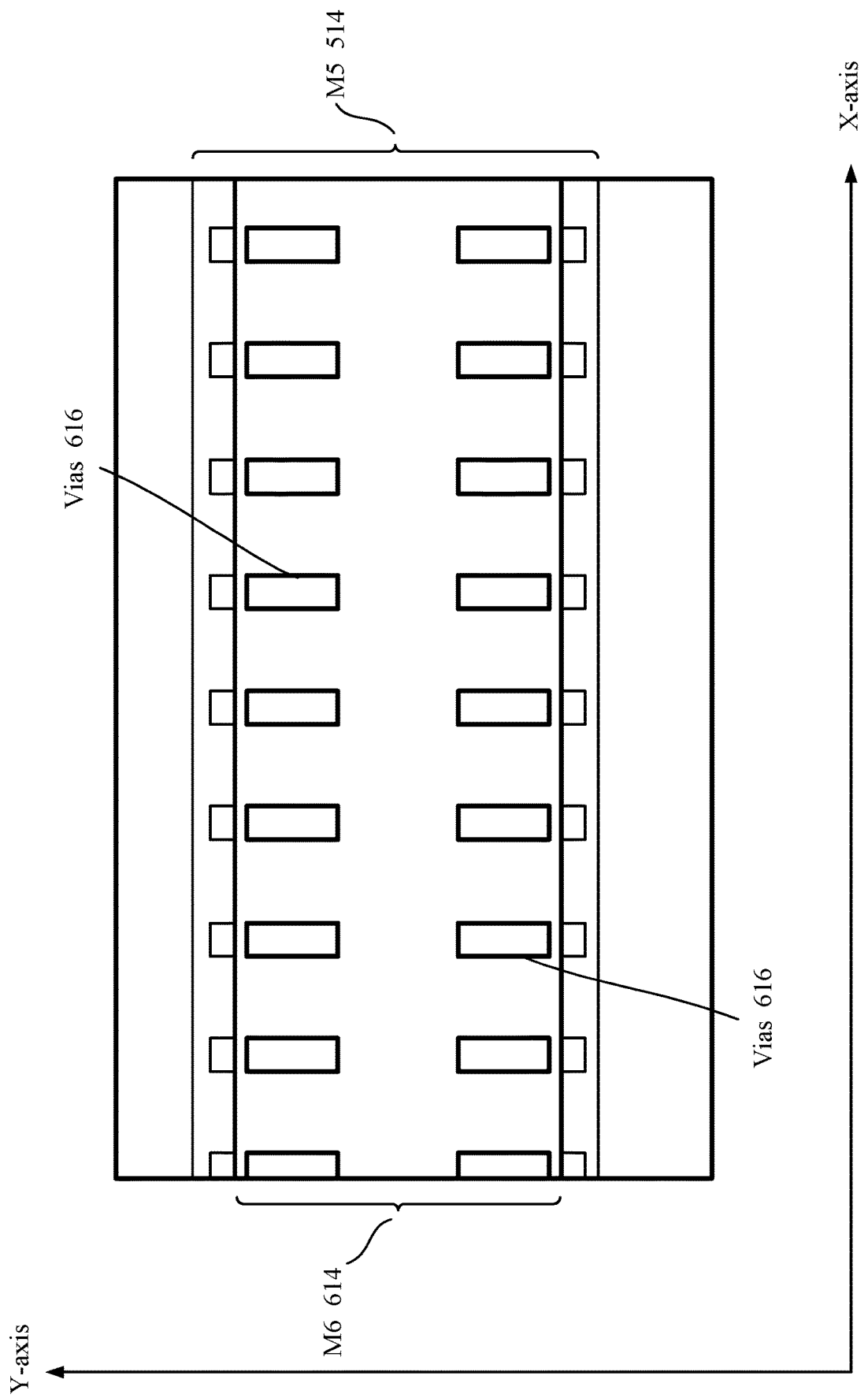
FIG. 6 illustrates example M5 and M6 metal layers, in accordance with certain aspects of the present disclosure.

FIG. 6 illustrates an example arrangement of an M5 rail 514 together with an M6 rail 614. As shown, the M5 rail 514 (e.g., having a width of 434 nm) is oriented in the x-direction and placed underneath the M6 rail 614 (e.g., having a width of 358 nm), which is also oriented in the x-direction. The M5 rail 514 may be electrically connected to the M6 rail 614 by rectangular vias 616.

Figure 7:
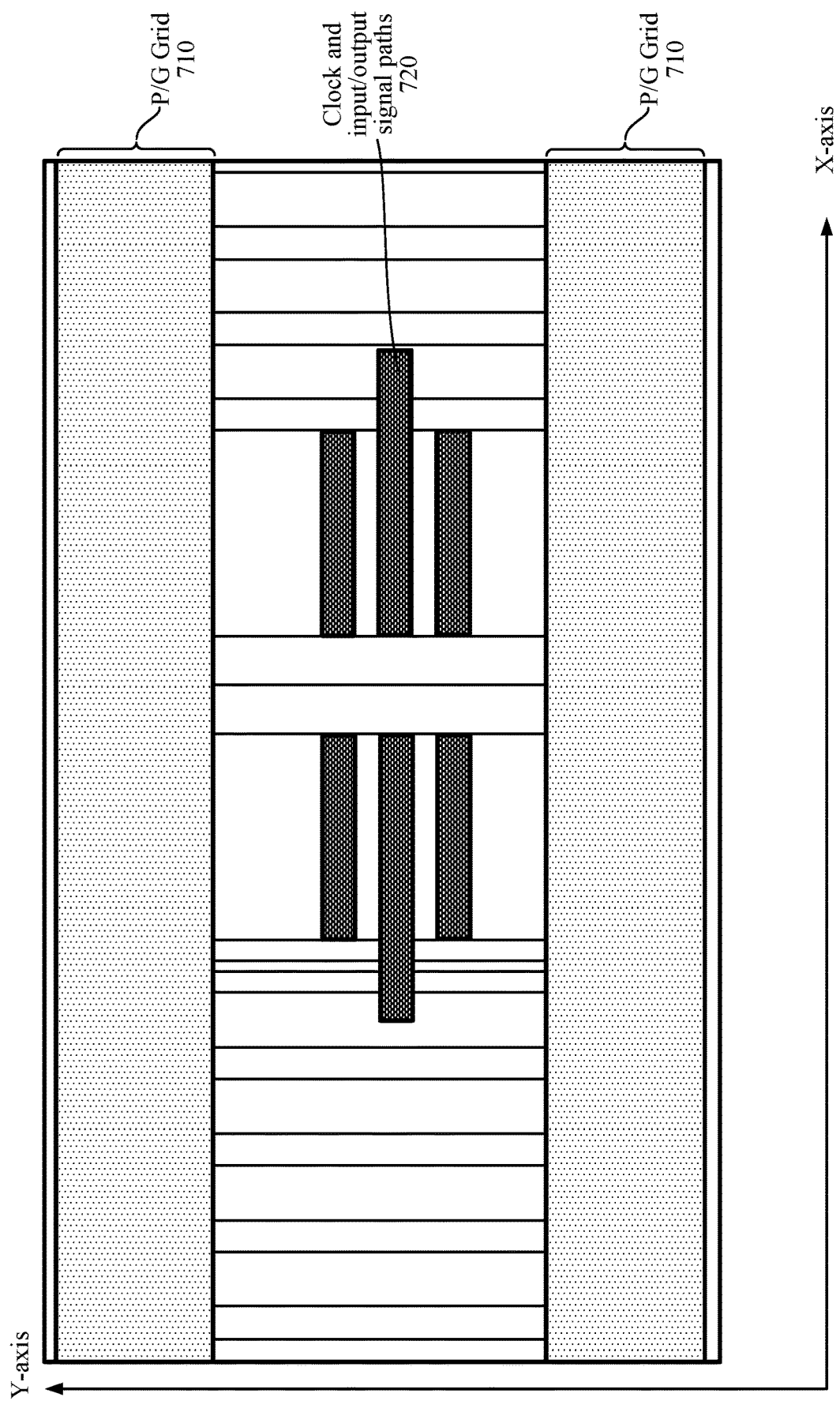
FIG. 7 illustrates an example P/G grid structure as well as clock and input/output signal paths, in accordance with certain aspects of the present disclosure.

FIG. 7 illustrates an example partial view of an integrated circuit with two P/G grid structures 710 as well as a number of clock and input/output signal paths 720. P/G grid structures 710 may each comprise a stack of M1 through M6 metal layers sandwiched together. For example, the M2 and M4 metal layers are stapled together using layer M3 and, on top, are metal layers M5 and M6. In some aspects, the logic rows corresponding to the power or ground metal traces of metal layers M2 through M4 are flipped (i.e., the logic under the metal traces) so that the power and/or ground traces can be shared underneath metal layers M5 and M6. Sharing power and/or ground rails (e.g., $V_{DD}$ and $V_{SS}$) allows metal layers M1 through M6 to be stapled together and permits the input/output signals to bypass the lower-level metal layers and directly reach metal layer M5.

In some aspects, the high-speed, low-power signals may comprise clock signals. The clock signals, in some aspects, may be generated by a clock signal generator external to the IC and received by the IC through conductors, such as clock pins. In some other aspects, the clock signals may be generated internal to the IC.

In some cases, shielding may be used to isolate and protect high-speed, low-power signals, such as clock signals, from electric fields that may interfere with the signals. For example, one shielding technique may use narrow lines (e.g., guard traces), which are connected to ground, around the high-speed, low-power signal paths. However, as described above, in some cases, the IC may be constructed with small channel (e.g., 8 nm) ultra-low-threshold-voltage implanted devices. In such cases, because of the small size of the IC's footprint, using shielding may not be possible or may occupy space that could be used by other components. Accordingly, in some aspects, the high-speed, low-power signals may be shielded with ground rails that are already part of the power/ground grid instead of using adjacent line shielding in order to reduce the extra space line shielding involves. In some aspects, ground rails are placed on one or more of the metal layers to serve as shielding for high-speed clock signals. For example, a P/G grid may comprise an M7 layer on which ground rails oriented in the y-direction may be placed to serve as shielding for high-speed, low-power signals. In some aspects, for extremely sensitive clock signals, ground rails may be strategically placed on the M7 layer and an additional M8 layer (disposed above the M7 layer) to shadow the high-speed, low-power signal paths of the M5 layer. As used herein, to "shadow" a signal path generally refers to closely following that signal path with another signal path, on the same or a different layer from the signal path.

Figure 8:
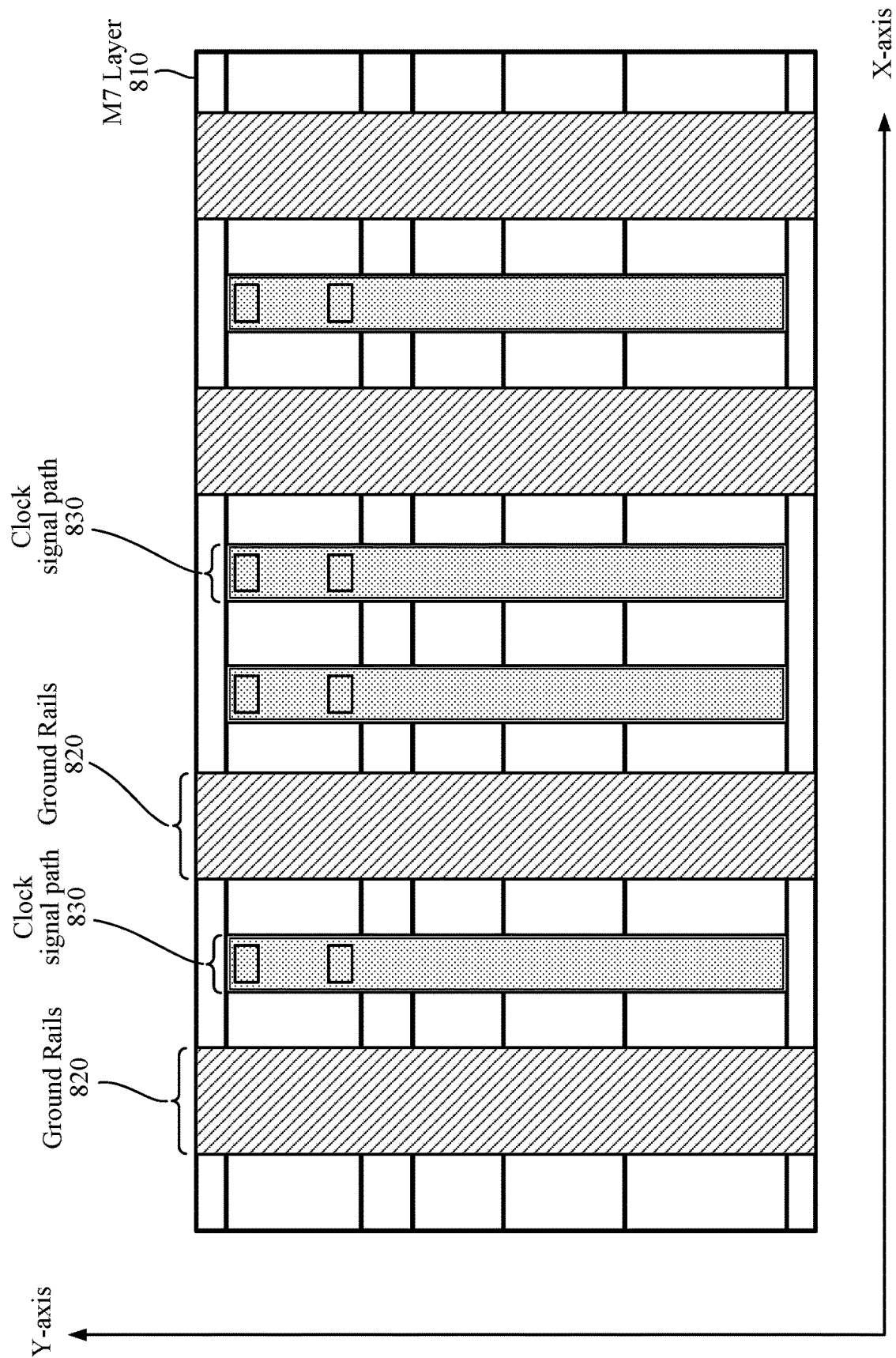
FIG. 8 illustrates an example M7 layer with ground rails that shield high-speed, low-power signals, in accordance with certain aspects of the present disclosure.

FIG. 8 illustrates an example M7 layer 810 with ground rails that shield high-speed, low-power signals. As shown, the ground rails 820 are placed on both sides of each signal path 830 to act as shielding, thereby circumventing the need for adding additional shielding. As shown, because no additional shielding is used, extra space is made available that allows the ground rails 820 to be wider, allowing more current flow to the circuit. In some aspects, ground rails 820 are 200-250 nm wide.

Figure 9:
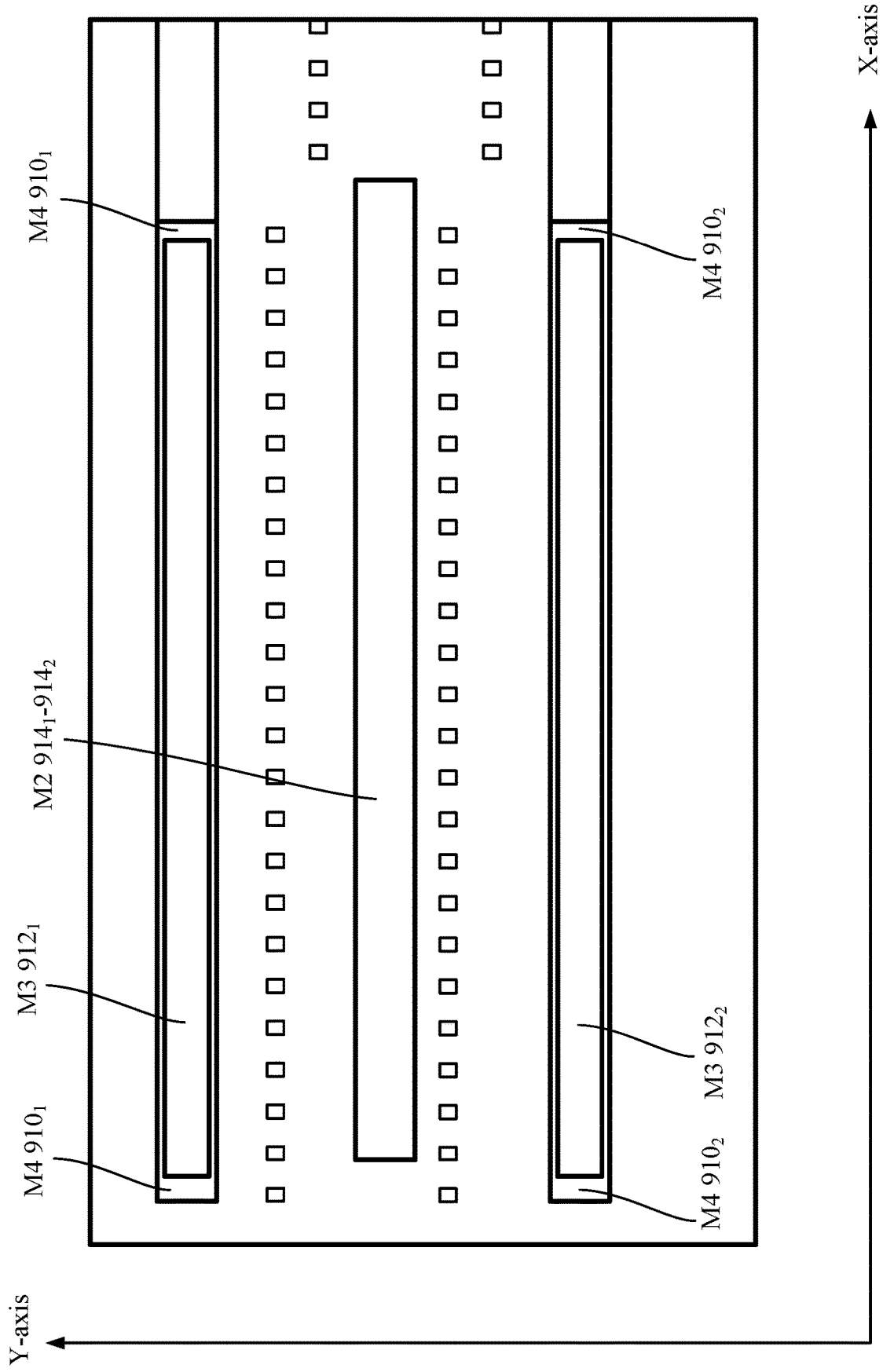
FIG. 9 illustrates an example implementation of two sets of M2, M3, and M4 traces, in accordance with certain aspects of the present disclosure.

In some aspects, two sets of M2, M3, and/or M4 traces may be used in parallel to significantly cut the output signal resistance of these signal paths, thereby reducing the IR drop. FIG. 9 illustrates two sets of M2, M3, and M4 traces placed parallel to each other. For example, M2 may comprise a first set of M2 traces $914_1$ running in parallel to a second set of M2 traces $914_2$ (i.e., two sets of M2 traces 914 running on the M2 layer). Similarly, M3 may comprise a first set of M3 traces $912_1$ running in parallel to a second set of M3 traces $912_2$ (i.e., two sets of M3 traces 912 running on the M3 layer). Also, M4 may comprise a first set of M4 traces $910_1$ running in parallel to a second set of M4 traces $910_2$ (i.e., two sets of M4 traces running on the M4 layer). In some aspects, the input/output signals go to M5 and higher to avoid the lower-level metal layers (e.g., M1-M4) as the lower-level metal layers may be more resistive and less conductive. For example, in some aspects, the input/output signal traces are run in parallel from M2 to M5 to avoid the higher resistivity of M2 to M4.

Figure 10:
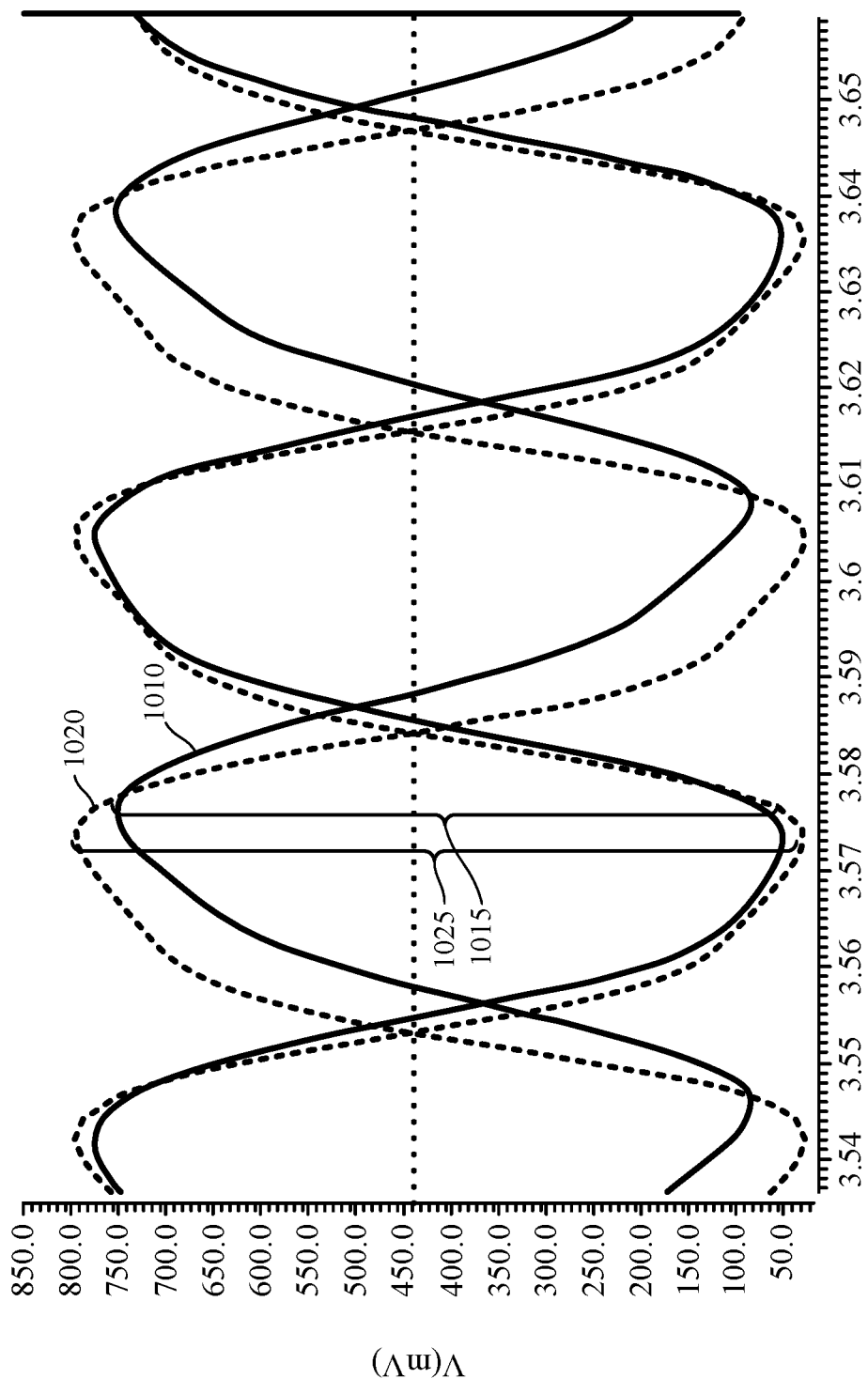
FIG. 10 illustrates example eye diagrams corresponding to the layout techniques described herein, in accordance with certain aspects of the present disclosure.

The one or more aspects described above result in significant improvements to the peak-to-peak eye of the signal. FIG. 10 illustrates two eye diagrams, eye diagram 1010 and eye diagram 1020. An eye diagram is an oscilloscope display in which a digital signal from a receiver is repetitively sampled and applied to the vertical input, while the data rate is used to trigger the horizontal sweep. The eye width is a measure of the horizontal opening of an eye diagram. Ideally, the eye width would be measured between the crossing points of the eye. However, jitter may appear on the waveform and influence the eye opening. The height of an eye opening in an eye diagram corresponds to the signal-to-noise ratio (SNR). The higher the height, the higher the SNR. For example, the peak-to-peak height of eye diagram 1010 is shown as height 1015, which is smaller than the peak-to-peak height of eye diagram 1025. This indicates that implementing the aspects described herein results in a reduction in IR drop and a higher SNR.

Figure 11:
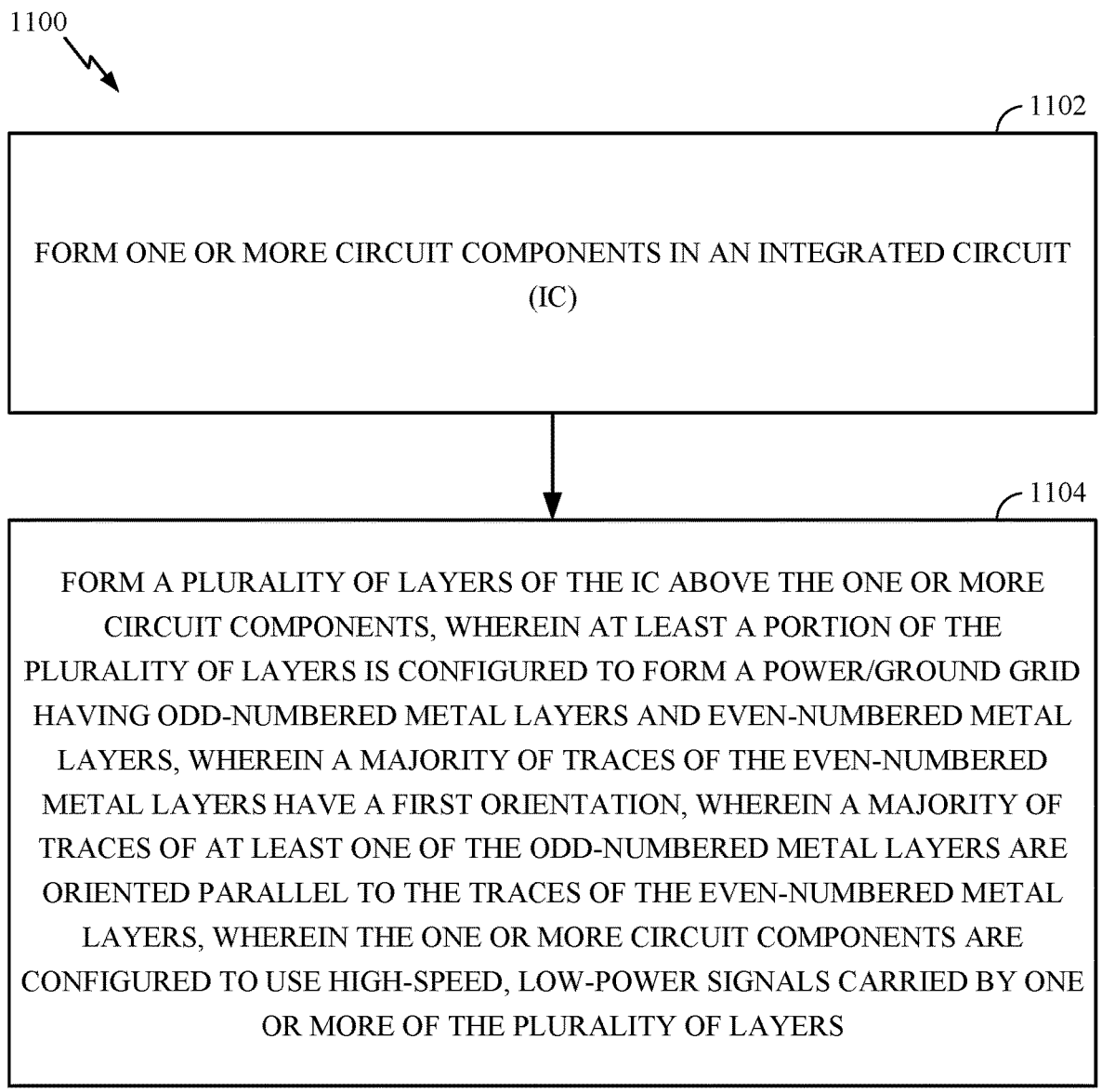
FIG. 11 illustrates example operations for fabricating an integrated circuit (IC), in accordance with certain aspects of the present disclosure.

FIG. 11 illustrates example operations 1100 for fabricating an integrated circuit (IC), in accordance with certain aspects. The operations 1100 may begin, at 1102, by forming one or more circuit components (e.g., transistors) in the IC. At 1104, the operations 1100 continue by forming a plurality of layers of the IC above the one or more circuit components, wherein at least a portion of the plurality of layers is configured to form a power/ground grid having odd-numbered metal layers and even-numbered metal layers, wherein a majority of traces of the even-numbered metal layers have a first orientation, wherein a majority of traces of at least one of the odd-numbered metal layers are oriented parallel to the traces of the even-numbered metal layers, and wherein the one or more circuit components are configured to use high-speed, low-power signals carried by one or more of the plurality of layers.

The IC fabricated by the operations 1100, in certain aspects, may include n metal layers of M1 through Mn (e.g., including metal layers M1 through M6 as well as M7 and M8, among others). In such aspects, the metal layers are formed as shown in FIG. 1. In some aspects, one or more circuit components are formed in the IC that are configured to use high-speed, low-power signals carried by one or more of the M1-Mn metal layers.

As described above, certain aspects relate to layout techniques for high-speed, low-power signal paths designed with small channel devices (e.g., having a width of 8 nm). In order to reduce the voltage drop and, thereby, reduce the amount of power required to compensate for the voltage drop (IR drop) associated with the signal path of the small channel device, in some aspects, traces of at least one odd-numbered metal layer may be oriented parallel to the traces of even-numbered metal layers. For example, in some aspects, the M5 trace(s) may run in the x-direction (e.g., parallel to the traces of M2, M4, and M6, as shown in FIGS. 5 and 6) while the majority of traces of the M1 and M3 metal layers may run in the y-direction (e.g., as shown in FIGS. 2-4). In some aspects, in addition to or instead of the M5 trace(s), the M3 traces may be oriented in the x-direction (e.g., parallel to the traces of M2, M4, and M6). FIG. 5, as described above, illustrates an example arrangement of an M5 rail 514 together with M4 rails 512 resulting from the operations 1100. Similarly, FIG. 6 illustrates an example arrangement of an M5 rail 514 together with an M6 rail 614 resulting from the operations 1100.

As described above, in some aspects, the high-speed, low-power signals may comprise clock signals. The clock signals, in some aspects, may be generated by a clock signal generator external to the IC and received by the IC through conductors (e.g., clock pins) that are formed in the IC. In some other aspects, the clock signals may be generated internal to the IC. In certain aspects, the clock signals are used by the IC's electrical components for synchronizing data transfer among each other.

In some aspects, as described above, the high-speed, low-power signals may be shielded with ground rails that are already part of the power/ground grid instead of using adjacent line shielding in order to reduce the extra space line shielding involves. In some aspects, ground rails are placed on one or more of the metal layers to serve as shielding for high-speed clock signals. For example, a P/G grid may comprise an M7 layer on which ground rails oriented in the y-direction may be placed to serve as shielding for high-speed, low-power signals. In some aspects, for extremely sensitive clock signals, ground rails may be strategically placed on the M7 layer and an additional M8 layer to shadow the high-speed, low-power signal paths of the M5 layer. An example of strategically placing ground rails on a metal layer (e.g., M7) to shield a high-speed, low-power signal path is illustrated in FIG. 8.

In some aspects, as described above, two sets of M2, M3, and/or M4 traces may be used in parallel to significantly cut the output signal resistance of these signal paths, thereby reducing the IR drop. As described above, FIG. 9 illustrates two sets of M2, M3, and M4 traces placed parallel to each other. For example, M2 may comprise a first set of M2 traces $914_1$ running in parallel to a second set of M2 traces $914_2$ (i.e., two sets of M2 traces 914 running on the M2 layer). Similarly, M3 may comprise a first set of M3 traces $912_1$ running in parallel to a second set of M3 traces $912_2$ (i.e., two sets of M3 traces 912 running on the M3 layer). Also, M4 may comprise a first set of M4 traces $910_1$ running in parallel to a second set of M4 traces $910_2$ (i.e., two sets of M4 traces running on the M4 layer). In some aspects, the input/output signals go to M5 and higher to avoid the lower level metal layers (e.g., M1-M4), as described above.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An integrated circuit (IC) comprising:
   a plurality of layers, wherein at least a portion of the plurality of layers is configured to form a power/ground grid having odd-numbered metal layers and even-numbered metal layers, wherein a majority of traces of the even-numbered metal layers have a first orientation, and wherein a majority of traces of at least one of the odd-numbered metal layers are oriented parallel to the majority of the traces of the even-numbered metal layers, wherein the odd-numbered metal layers comprise a first metal layer (M1), a third metal layer (M3), and a fifth metal layer (M5), wherein M1 is disposed beneath M3, wherein M3 is disposed beneath M5, and wherein the even-numbered metal layers comprise a second metal layer (M2) disposed between M1 and M3, a fourth metal layer (M4) disposed between M3 and M5, and a sixth metal layer (M6) disposed above M5; and
   one or more circuit components configured to use high-speed, low-power signals carried by one or more of the plurality of layers.

2. The IC of claim 1, wherein a majority of traces of the odd-numbered metal layers, other than the at least one of the odd-numbered metal layers, have a second orientation perpendicular to the first orientation.

3. The IC of claim 1, wherein widths of the traces in the odd-numbered metal layers are monotonically increasing from M1 to M5 and wherein widths of the traces in the even-numbered metal layers are monotonically increasing from M2 to M6.

4. The IC of claim 1, wherein the at least one of the odd-numbered metal layers is M5.

5. The IC of claim 4, wherein a set of traces of M3 are oriented parallel to a set of traces of M2, a set of traces of M4, a set of traces of M5, and a set of traces of M6.

6. The IC of claim 5, wherein a set of traces of M1 are oriented perpendicular to the set of traces of M2, the set of traces of M3, the set of traces of M4, the set of traces of M5, and the set of traces of M6.

7. The IC of claim 5, wherein M2 comprises another set of M2 traces running in parallel to the set of traces of M2, wherein M3 comprises another set of M3 traces running in parallel to the set of traces of M3, and wherein M4 comprises another set of M4 traces running in parallel to the set of traces of M4.

8. The IC of claim 3, wherein the power/ground grid further comprises a seventh metal layer (M7) disposed above M6 and an eighth metal layer (M8) disposed above M7.

9. The IC of claim 8, wherein M7 comprises ground rails to serve as shielding for the high-speed, low-power signals, and wherein the ground rails of M7 have a second orientation perpendicular to the first orientation.

10. The IC of claim 9, wherein M8 comprises ground rails to serve as shielding for the high-speed, low-power signals, and wherein the ground rails of M8 have the second orientation perpendicular to the first orientation.

11. The IC of claim 8, wherein the at least one of the odd-numbered metal layers is M5, wherein M7 and M8 comprise ground rails to serve as shielding for the high-speed, low-power signals, and wherein the ground rails of M7 and M8 shadow traces of M5.

12. The IC of claim 1, wherein the circuit components comprise small channel devices, each having a channel width of at most 8 nanometers (nm).

13. The IC of claim 1, wherein the circuit components comprise a plurality of threshold voltage (Vt) implanted devices.

14. The IC of claim 1 further comprising conductors for receiving the high-speed, low-power signals.

15. The IC of claim 14, wherein the conductors comprise clock pins, wherein the high-speed, low-power signals are clock signals generated by a clock signal generator, and wherein the clock signals are used by the one or more circuit components for synchronizing data transfer between the one or more circuit components.

16. A method of fabricating an integrated circuit (IC), the method comprising:
    forming one or more circuit components in the IC; and
    forming a plurality of layers of the IC above the one or more circuit components, wherein at least a portion of the plurality of layers is configured to form a power/ground grid having odd-numbered metal layers and even-numbered metal layers, wherein a majority of traces of the even-numbered metal layers have a first orientation, wherein a majority of traces of at least one of the odd-numbered metal layers are oriented parallel to the traces of the even-numbered metal layers, and wherein the one or more circuit components are configured to use high-speed, low-power signals carried by one or more of the plurality of layers, wherein the odd-numbered metal layers comprise a first metal layer (M1), a third metal layer (M3), and a fifth metal layer (M5), wherein M1 is disposed beneath M3, wherein M3 is disposed beneath M5, and wherein the even-numbered metal layers comprise a second metal layer (M2) disposed between M1 and M3, a fourth metal layer (M4) disposed between M3 and M5, and a sixth metal layer (M6) disposed above M5.

17. The method of claim 16, wherein a majority of traces of the odd-numbered metal layers, other than the at least one of the odd-numbered metal layers, have a second orientation perpendicular to the first orientation.

18. The method of claim 16, wherein the at least one of the odd-numbered metal layers is M5.

* * * * *